(12) United States Patent
Anantharaman et al.

(10) Patent No.: US 7,975,247 B2
(45) Date of Patent: Jul. 5, 2011

(54) METHOD AND SYSTEM FOR ORGANIZING DATA GENERATED BY ELECTRONIC DESIGN AUTOMATION TOOLS

(75) Inventors: Srinath Anantharaman, Pleasanton, CA (US); Sriram Rajamanohar, Fremont, CA (US); Anagha Pandharpurkar, Fremont, CA (US); Karim Khalfan, San Jose, CA (US)

(73) Assignee: Cliosoft Inc., Fremont, CA (US)

( * ) Notice: Subject to any disclaimer, the term of this patent is extended or adjusted under 35 U.S.C. 154(b) by 336 days.

(21) Appl. No.: 12/229,972

(22) Filed: Aug. 28, 2008

(65) Prior Publication Data

US 2010/0058277 A1 Mar. 4, 2010

(51) Int. Cl.
*G06F 17/50* (2006.01)
(52) U.S. Cl. ....................................................... 716/100
(58) Field of Classification Search ................. 716/1, 11, 716/100
See application file for complete search history.

(56) References Cited

U.S. PATENT DOCUMENTS

| 5,950,201 | A  | * | 9/1999  | Van Huben et al. ................... 1/1 |
| 5,983,277 | A  | * | 11/1999 | Heile et al. ..................... 709/232 |
| 6,654,747 | B1 | * | 11/2003 | Van Huben et al. ................... 1/1 |
| 2002/0162077 | A1 | * | 10/2002 | Jeng et al. ........................ 716/1 |
| 2007/0050428 | A1 | * | 3/2007  | Anantharaman et al. ..... 707/203 |

* cited by examiner

*Primary Examiner* — Jack Chiang
*Assistant Examiner* — Suchin Parihar

(57) ABSTRACT

A method and system for organizing a plurality of files generated by an Electronic Design and Automation (EDA) tool into composite objects is disclosed. The system provides a plurality of rules, which may be configured for various EDA tools. These rules may be configured for any EDA tool by specifying various parameters such as filename patterns, file formats, directory name patterns, and the like. Using these rules which are configured for an EDA tool, the files that form a part of the design objects are identified and packaged in the form of composite objects.

21 Claims, 7 Drawing Sheets

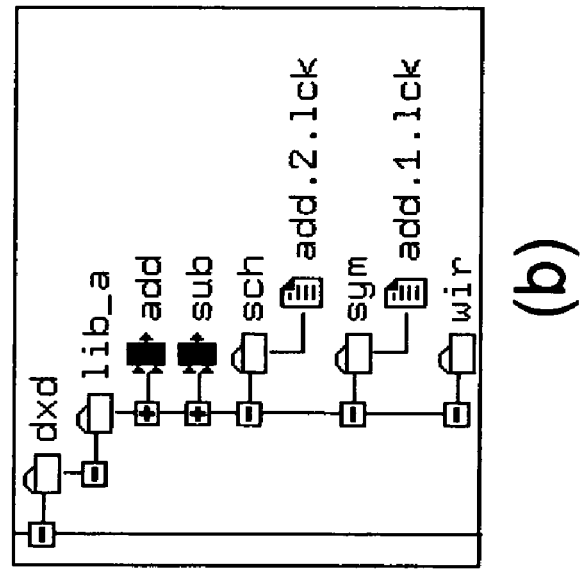
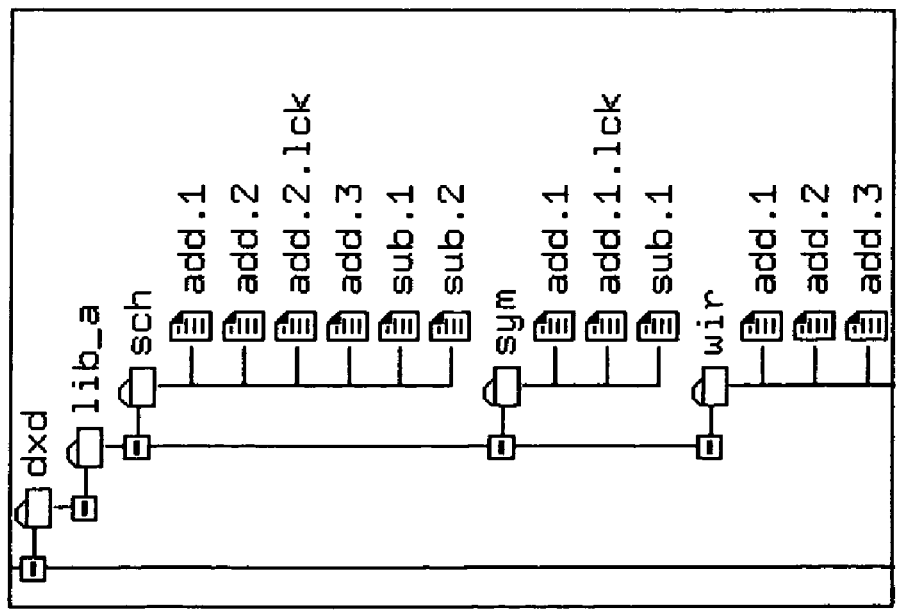
FIG. 4

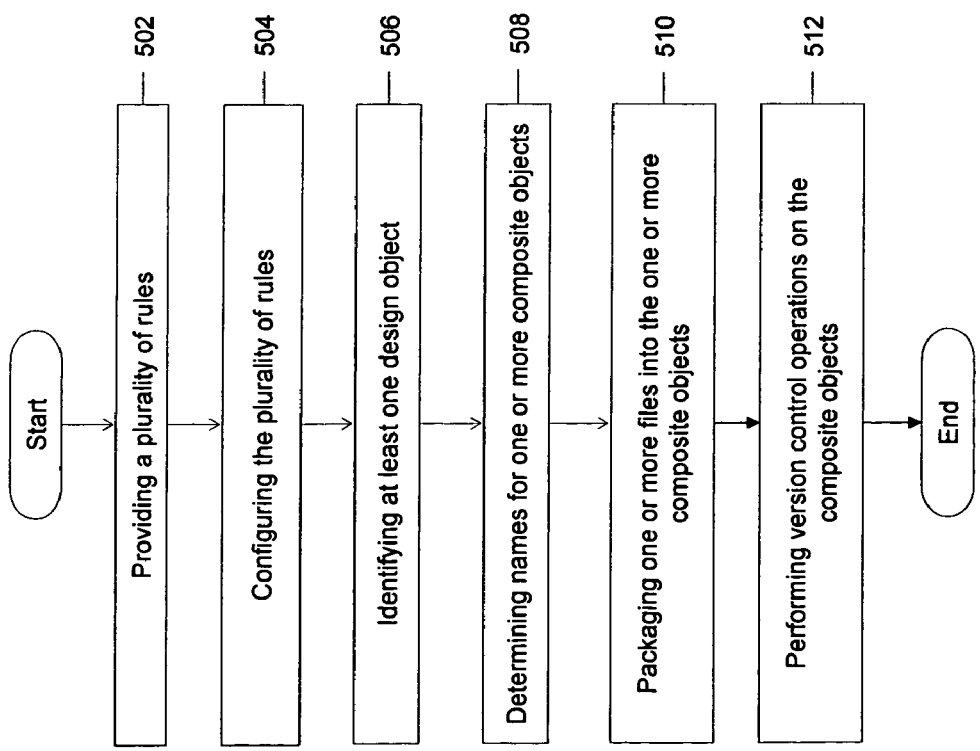

METHOD AND SYSTEM FOR ORGANIZING DATA GENERATED BY ELECTRONIC DESIGN AUTOMATION TOOLS

BACKGROUND OF THE INVENTION

The present invention generally relates to the field of data management. More specifically, the present invention relates to a method, system and computer program product for organizing data in an Electronic Design and Automation (EDA) tool.

Circuit designing includes creating schematic diagrams, floor-planning, performing logic synthesis, performing simulations, performing verification, preparing mask data, placing and routing, creating a Printed Circuit Board (PCB) layout, and the like. These functions are performed by various EDA tools. EDA tools create several design objects. Each design object comprises multiple files with program-generated names, for example, master.tag, sch.cdb, verilog.v, prop.xx, and the like. In addition, several temporary and run files are created by the EDA tool, for example, log files, execution files, backup files, and the like.

Generally, a user of an EDA tool works at higher abstraction levels, such as libraries and cells, and may not be aware of these individual files. Hence, it becomes difficult for users to understand the construction of individual design units and various other files created by the EDA tool. Users do not know which files should be managed together, which need to be managed as different versions of the same file, which should not be managed, and so forth. Therefore, users may find difficulty in versioning and managing several files generated by the EDA tool.

In the current state of technology, several solutions are available to manage design data generated by EDA tools, for example, Cliosoft SOS™ for Cadence Virtuoso™, Enovia DesignSync™ for Cadence Virtuoso™, and Cliosoft SOS™ for Mentor ICstudio™. The present systems provide a solution to the problems mentioned above by forming one or more composite objects from multiple files. The one or more composite objects are managed and versioned instead of individual files. However, these systems are only designed for a particular design tool and cannot manage files generated by other EDA tools.

In light of the above discussion, there is a need for an adaptable system and method for managing multiple files generated by a multitude of design tools.

SUMMARY

An object of the invention is to provide a system for organizing files generated by various Electronic Design Automation (EDA) tools.

Another object of the invention is to organize a plurality of files generated by an EDA tool.

Yet another object of the invention is to provide a mechanism that configures the system for organizing the plurality of files generated by a plurality of EDA tools.

To achieve the above objectives, the invention provides a method, system and computer program product for organizing a plurality of files. The system provides a plurality of rules that may be configured for any EDA tool. The plurality of rules is configured by specifying various parameters such as filename patterns, file formats, directory name patterns, and the like, for the plurality of files. Further, these rules may be configured to execute a software module provided by users. Using the rules configured for an EDA tool, the files that form a part of the design objects are identified and packaged in the form of composite objects.

Various embodiments of the invention provide an adaptor that is capable of organizing files, which are generated by various EDA tools, into composite objects. These files can thereby be accessed together in the form of composite objects. This reduces the complexity in accessing and maintaining various individual files. Further, the memory size required to maintain composite objects is less than that of maintaining individual files.

BRIEF DESCRIPTION OF THE DRAWINGS

Various embodiments of the invention will hereinafter be described in conjunction with the appended drawings provided to illustrate and not to limit the invention, wherein like designations denote like elements, and in which:

FIG. 4 is a screenshot of the files generated by the EDA tool and the composite objects formed by the version control adaptor, in accordance with an embodiment of the invention;

FIG. 5 is a flowchart depicting a method for organizing various files generated by the EDA tool, in accordance with various embodiments of the invention.

DETAILED DESCRIPTION OF THE INVENTION

The invention provides a system and a method for organizing a plurality of files generated by an Electronic Design Automation (EDA) tool. Electronic circuit designing, as facilitated by EDA tools, includes creating schematic diagrams, floor-planning, performing logic synthesis, performing simulations, performing verification, preparing mask data, placing and routing, creating a Printed Circuit Board (PCB) layout, and the like. These functions are performed by various EDA tools, which generate numerous files and their versions to create a particular design object. Files that represent a particular scheme or design are generally maintained in a distributed manner in libraries which are generated by EDA tools. The collection of such files forms a design object.

It will be apparent to any person skilled in the art that the invention may be applied to other design tools as well, for example, mechanical Computer Aided Designing (CAD) tools, graphics design tools, drafting tools, and the like. For the purpose of simplicity, the invention will hereinafter be described with reference to EDA tools.

Figure 1:
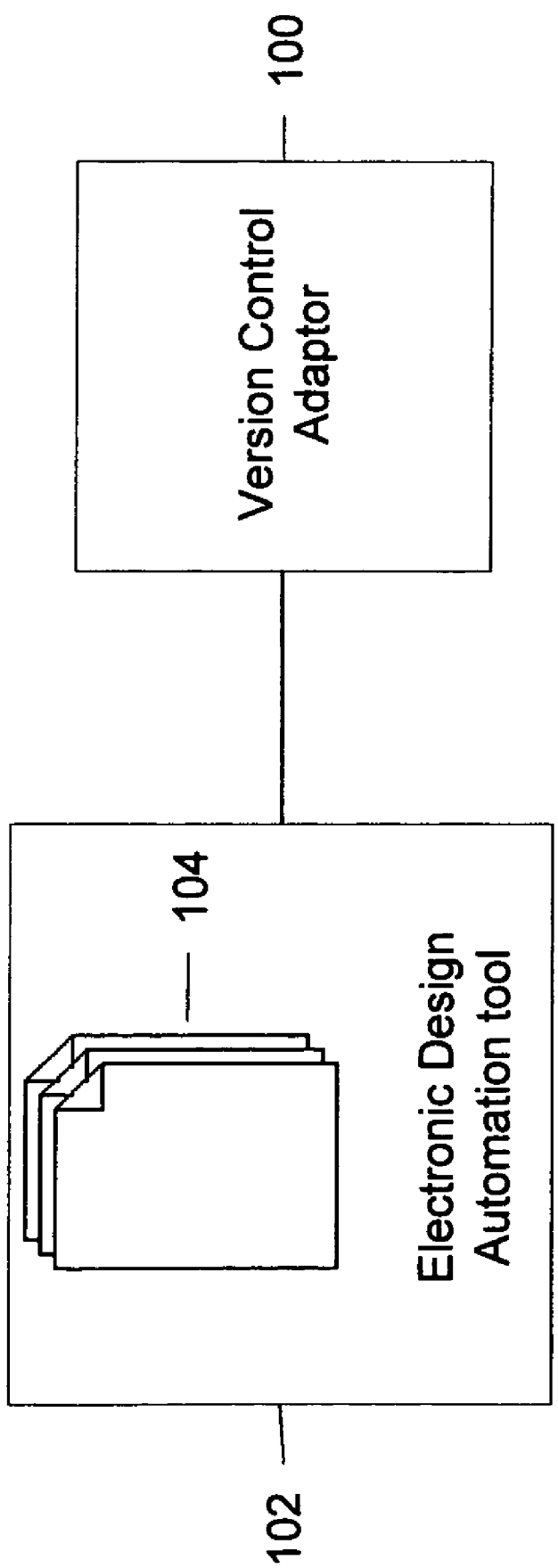
FIG. 1 is a block diagram depicting an environment in which various embodiments of the invention can be practiced.

FIG. 1 is a block diagram depicting an environment in which various embodiments of the invention can be practiced. The environment includes a version control adaptor 100, an Electronic Design Automation (EDA) tool 102, and a plurality of files, such as files 104. Version control adaptor 100 organizes files 104 generated by EDA tool 102. EDA tool 102 is used to perform various tasks such as electronic circuit simulation, PCB layout design, integrated circuit design, and the like. During operation, EDA tool 102 generates files 104 such as design files, simulation data files, synthesis files, layout files, and the like. In addition, files 104 may include temporary and execution files.

In various embodiments of the invention, version control adaptor 100 may be configured for any EDA tool to organize the files generated by the EDA tool. In an embodiment of the invention, version control adaptor 100 organizes files 104 into a collection of files, each representing a design object or a particular version of the design object while excluding temporary and execution files. These collections of files are hereinafter referred to as composite objects. Version control adaptor 100 also facilitates a user to view files 104 in the form of composite objects and not as individual files.

Figure 2:
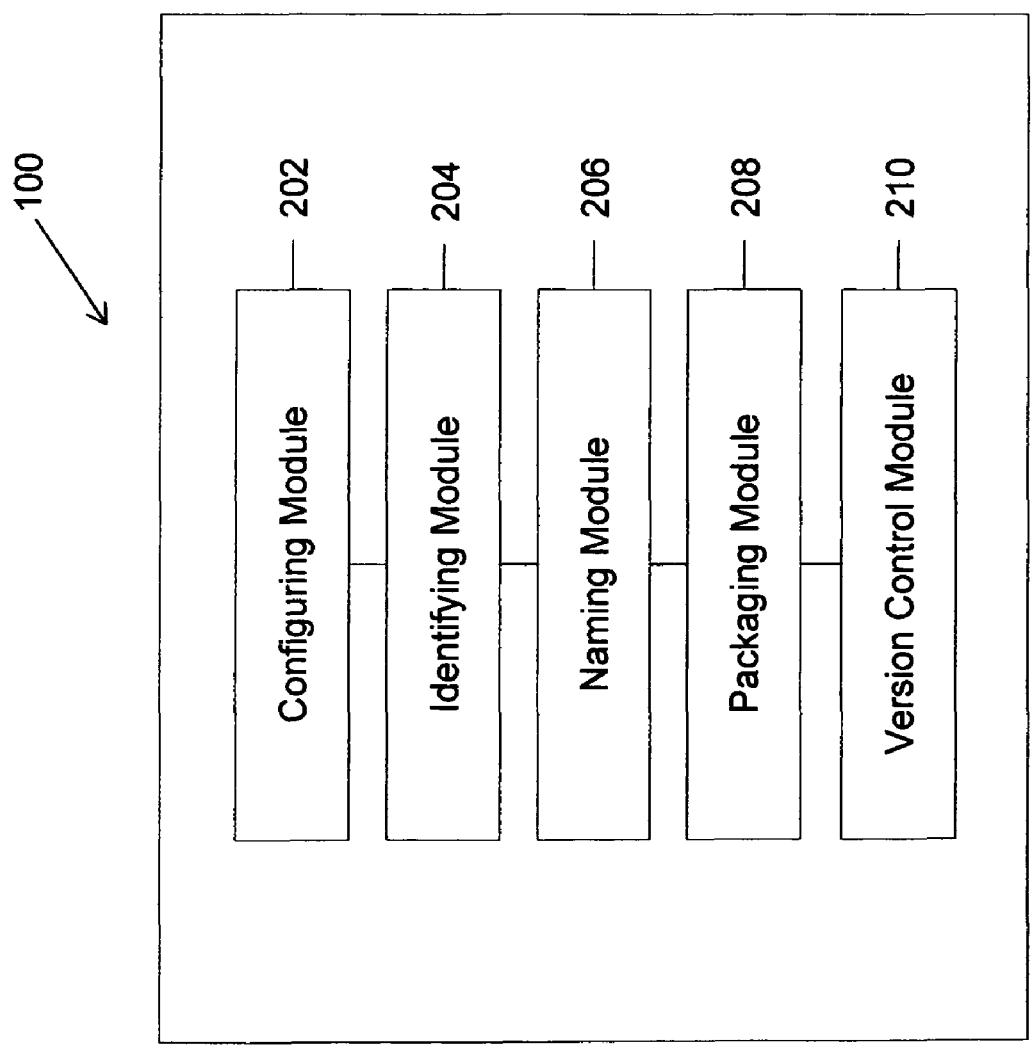
FIG. 2 is a block diagram of a version control adaptor for organizing various files generated by an Electronic Design Automation (EDA) tool, in accordance with various embodiments of the invention.

FIG. 2 is a block diagram of version control adaptor 100 for organizing files 104 generated by EDA tool 102, in accordance with various embodiments of the invention. Version control adaptor 100 includes a configuring module 202, an identifying module 204, a naming module 206, a packaging module 208, and a version control module 210.

Version control adaptor 100 maintains a set of rules to be used to organize files 104 generated by EDA tool 102. Configuring module 202 configures the set of rules for a particular EDA tool, such as EDA tool 102. In an embodiment of the invention, the set of rules is configured by using a configuration file provided by EDA tool 102. The configuration file may specify various filename patterns, file formats, and directory name patterns for the identification of files to be organized.

In another embodiment of the invention, configuring module 202 provides the rules to the user though a user-interface to be configured for EDA tool 102. To configure these rules for EDA tool 102, the user may specify various filename patterns, file formats, and directory name patterns for the identification of files to be organized. In another embodiment of the invention, the rules may be configured to execute various software modules for identification of files and/or directories. These software modules are provided by the user. In an embodiment of the invention, the user is the electronic circuit designer and uses EDA tool 102 for circuit designing. In another embodiment of the invention, the user may be a system administrator who configures version control adaptor 100 for specific requirements of any EDA tool and provides the configured version control adaptor 100 to the electronic circuit designer. These configured rules are thereafter stored in a memory associated with version control adaptor 100.

Identifying module 204 identifies various design objects amongst files 104 generated by EDA tool 102. In various embodiments of the invention, the set of rules configured for EDA tool 102 are used to identify various design objects. In an embodiment of the invention, these design objects can be identified by matching the various filename patterns, file formats, and directory name patterns for the plurality of files with the ones specified in the configured rules.

Naming module 206 determines the names for the composite object that needs to be formed for the identified design objects. In various embodiments of the invention, these names are determined on the basis of the configured rules. In an embodiment of the invention, these names may be determined on the basis of the filename patterns, file formats, and directory name patterns of the files and/or directories which form a part of the design objects. In another embodiment of the invention, these names are determined on the basis of the software modules executed by the configured rules.

Packaging module 208 packages one or more files from files 104 into one or more composite objects. The files to be included in the composite objects are determined on the basis of the configured rules. For example, the files in a directory "schematic" may be packaged in a composite object named "schematic.cds". This facilitates users to access the composite objects in a manner similar to accessing a single file.

Version control module 210 creates a new version of at least one of the one or more composite objects when at least one file of the one or more composite objects is modified, one or more files are added to the one or more composite objects, or one or more files are deleted from the composite objects. In various embodiments of the invention, different versions of design objects are packaged in different composite objects. Version control module 210 re-applies the configured rules on the composite objects when they are checked in to version control module 210 by a user. It will be apparent to any person skilled in the art that the composite objects generated by EDA tool 102 are checked out by the users by using version control adaptor 100 before the commencement of a task and are checked in to version control adaptor 100 on the completion of the task. Various modifications may be made by the users to the composite objects during the operation of the task on the composite objects.

By re-applying the configured rules on the composite objects, the modified files and/or newly added files to the composite object, and/or files removed from the composite object are identified by version control module 210, and a new version of the composite object is formed by packaging module 208. As stated earlier, the files to be included and/or excluded in the new version of the one or more composite objects are determined by packaging module 208 (using inclusion module 306 and exclusion module 308 of FIG. 3) for each version of the composite object.

Figure 3:
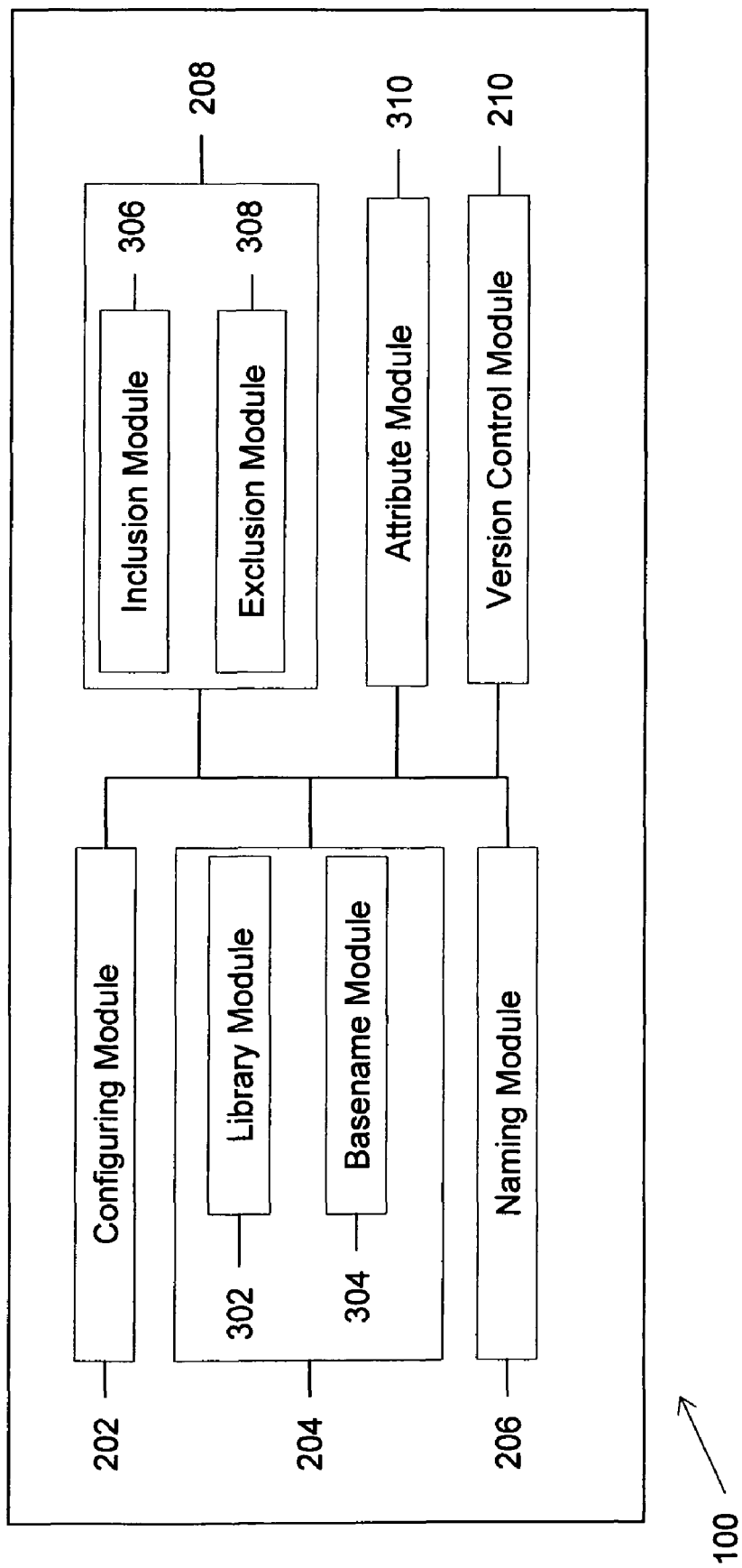
FIG. 3 is a block diagram of the version control adaptor for organizing various files generated by the EDA tool, in accordance with an embodiment of the invention.

FIG. 3 is a more detailed block diagram of version control adaptor 100 for organizing various files 104 generated by EDA tool 102, in accordance with an embodiment of the invention. Version control adaptor 100 includes configuring module 202, identifying module 204 including a library module 302 and a basename module 304, naming module 206, packaging module 208 including an inclusion module 306 and an exclusion module 308, an attribute module 310, and version control module 210.

Library module 302 identifies a directory generated by EDA tool 102 as a design library. In various embodiments of the invention, library module 302 identifies the directory on the basis of the rules configured by the user. The design library includes all the files and/or directories of the design objects which need to be organized. Further, packaging module 208 forms the composite objects in the design library that is identified by library module 302.

Basename module 304 identifies various basenames of the design objects, based on the configured rules. These basenames are used by naming module 206 to determine the names for the composite objects. Basenames are also used by inclusion module 306 and exclusion module 308 to determine the files that constitute the composite object.

Inclusion module 306 identifies various files from files 104 that are required to be included in the one or more composite objects. In various embodiments of the invention, the files are identified on the basis of the rules configured for EDA tool 102.

Exclusion module 308 identifies one or more files that are not required in the composite object or are required to be excluded from the files identified by inclusion module 306. In various embodiments of the invention, these files are identified on the basis of the rules configured for EDA tool 102.

Attribute module 310 assigns one or more attributes to the composite objects that are packaged by packaging module 208. In various embodiments of the invention, these attributes may act as descriptors for the composite objects. In an embodiment of the invention, the attribute may be a tag that is assigned to a composite object. In another embodiment of the invention, the attribute may be an icon that is assigned to a composite object. In yet another embodiment of the invention, the attribute may be an action that is attached to a composite object. For example, a trigger may be assigned to the composite object that is enabled as soon as a composite object is accessed.

FIG. 4 is a screenshot of the files generated by an EDA tool and the composite objects formed by version control adaptor 100, in accordance with an embodiment of the invention. For example, a set of rules configured by a user for the files represented in FIG. 4(a) is given below:

```
package DxDesginer {
  libid matchall
    "sch",
    "sym",
    "wir";
  basename globany
    "sch/{*}.*",
    "sym/{*}.*",
    "wir/{*}.*";
  packname use "$1";
  include globplus
    "sch/$1.*",
    "sym/$1.*",
    "wir/$1.*";
  exclude glob "*.lck";
  attribute "icon" use "logic.jpg";
}
```

Version control adaptor 100 organizes the files represented in FIG. 4(a) by using a set of configured rules. According to the configured rules, library module 302 identifies a library, i.e., lib_a library as a design library, based on the existence of the directories that form the design objects. These directories are identified by their directory names, i.e., 'sch', 'sym' and 'wir'. Since lib_a contains all the three directories, it is identified as a design library.

Further, basename module 304 traverses through the lib_a design library and identifies the basenames of the design objects. In this event, the basenames are identified by finding a match for sch/{*}.*,sym/{*}.* or wir/{*}.*, where '{*}' denotes the basenames of the design objects. Here, 'add' and 'sub' are identified as the basenames of the design objects.

These basenames are used by naming module 206 to determine the names for the composite objects. Here, the names for the composite objects are determined as "$1", where $1 points to the identified basenames of the design object. In this example, naming module 206 determines 'add' and 'sub' as the names for the composite objects The configured rules provide an inclusion list and an exclusion list of the files. The files to be included should have the filename patterns matching with 'sch/$1.*', 'sym/$1.*' and wir/$1.*. The files to be excluded should have the filename patterns '*.lck'. Hence, seven files—sch/add.1-3, sym/add.1, and wir/add.1-3—are added to the composite object 'add', and three files—sch/sub.1-2 and sym/sub.1—are added to the composite object 'sub'. Further, two files having the filename patterns '*.lck', i.e., add.2.lck and add.1.lck are not included in the composite objects.

Further, the composite objects 'add' and 'sub' are assigned the icon attribute 'logic.jpg'.

FIG. 4(b) depicts the files generated by EDA tool 102 after they are organized by version control adaptor 100. The design library lib_a contains the composite objects, 'add' and 'sub', and the remaining files, which do not form a part of the composite objects, remain unchanged in the design library. Hence, version control adaptor 100 may be used by the users to organize the files that form a part of the various design objects.

FIG. 5 is a flowchart depicting a method for organizing various files generated by the EDA tool, in accordance with various embodiments of the invention.

At step 502, a set of rules is provided to a user. The rules may be provided to a user through a user interface or by means of configuration files that are provided for a particular EDA tool. In an embodiment of the invention, a version control adaptor, such as version control adaptor 100, provides these rules to the user. These rules can be configured for any EDA tool. The user is provided with these rules to configure them for his/her EDA tool. These rules, after being configured for a specific EDA tool, are used to organize the files generated by the EDA tool, such as files 104 generated by EDA tool 102. These rules, once configured by the users, specify the files and/or directories that are required to be organized and their distinguishing features so that these files and/or directories can be identified by the version control adaptor.

At step 504, the user configures the rules for an EDA tool. In various embodiments of the invention, the user configures the rules by specifying at least one of the various filename patterns, file formats, and directory name patterns for the files and/or directories generated by the EDA tool. The user may specify these parameters by means of a user interface or a configuration file to configure the rules. In an embodiment of the invention, the rules may be configured to invoke various software modules. These software modules can be provided by the user, and can be used according to the rules configured by the user to identify various files and directories based on various parameters. For example, one of the parameters may be the content of a file, which is identified by the execution of a particular software module.

At step 506, various design objects in libraries are identified on the basis of the rules. These libraries are generated by EDA tools and contain the files and/or directories that need to be organized. The configured rules contain various parameters specified by the user to identify the files and/or directories that form a part of the design objects. In other words, these parameters are used to identify the design objects and the files and/or directories that form a part of the design objects.

At step 508, the names for the composite objects are determined on the basis of the configured rules. These names need to be assigned to the composite objects that will be formed to organize the files and/or directories which form a part of the identified design objects. In various embodiments of the invention, the names for the composite objects are determined on the basis of the basenames of the identified design objects. This allows the user to easily associate the composite objects with the design objects or the type of design objects they want to access. Further, the file format for the composite object is also assigned on the basis of the configured rules. For example, if the basename of a design object is 'add', the name of the composite object that depicts this design object can be determined as 'add.lgc'.

At step 510, one or more files from the various files generated by the EDA tool are packaged into the one or more composite objects. The one or more files to be included in the composite objects are determined on the basis of the configured rules.

At step 512, version control operations are performed on the composite objects. A new version of at least one of the one or more composite objects is created when at least one file of the one or more composite objects is modified, one or more files are added to the one or more composite objects, or one or more files are deleted from the composite objects. In various embodiments of the invention, different versions of the design objects are packaged in different composite objects. The configured rules are re-applied on the composite objects when they are checked in to the version control adaptor by a user. It will be apparent to any person skilled in the art that the composite objects generated by the EDA tool are checked out by the users by using the version control adaptor before the commencement of a task, and are checked in to the version control adaptor on the completion of the task. Various modifications may be made by users to the composite objects during the operation of the task on the composite objects.

By re-applying the configured rules on the composite objects, the modified files and/or newly added files to the composite object and/or files removed from the composite object are identified by the version control module and a new version of the composite object is packaged, as described at step 510.

Figure 6A:
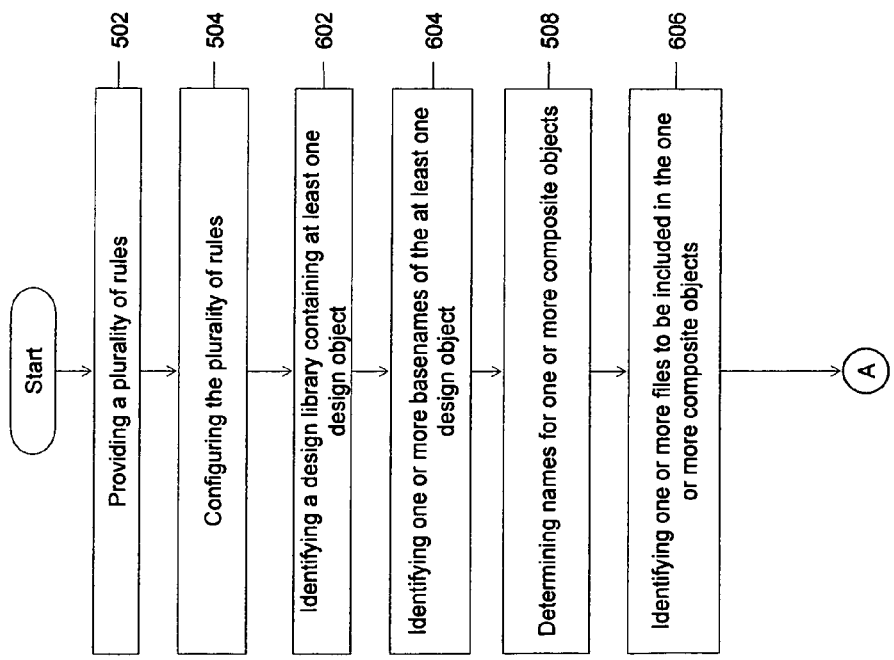
FIGS. 6(a) and (b) is a flowchart depicting a method for organizing various files generated by the EDA tool, in accordance with an embodiment of the invention.
Figure 6B:
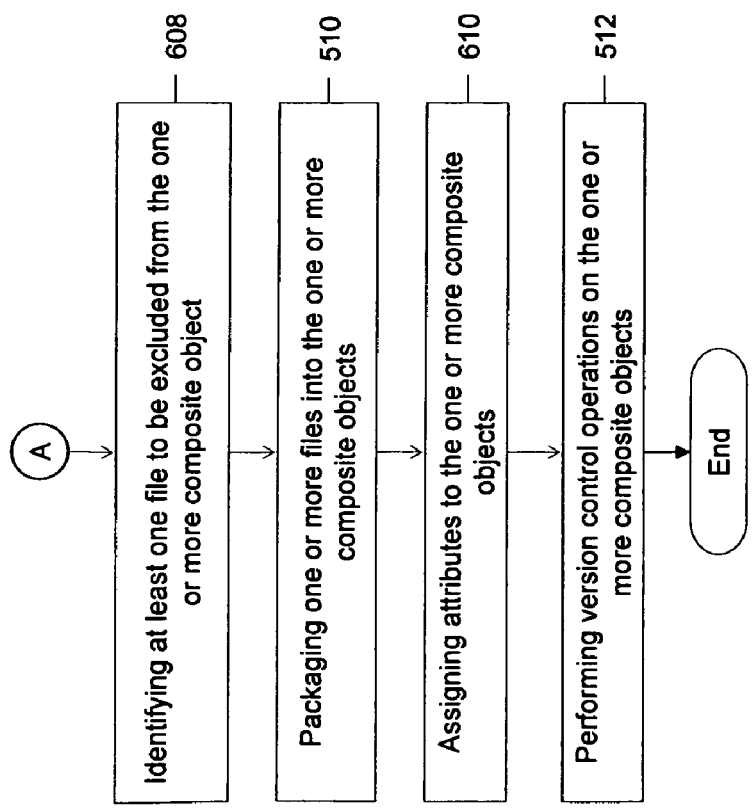

FIGS. 6(*a*) and 6(*b*) is a flowchart depicting a method for organizing various files generated by the EDA tool, in accordance with an embodiment of the invention.

At step 502, a set of rules is provided to a user. The rules may be provided to a user through a user interface or by means of configuration files.

At step 504, the user configures the rules by using an EDA tool. In various embodiments of the invention, the user configures the rules by specifying at least one of the various filename patterns, file formats, and directory name patterns for the files generated by the EDA tool. In an embodiment of the invention, the rules may be configured by the user to invoke various software modules At step 602, a directory generated by the EDA tool is identified as a design library. In various embodiments of the invention, the directory is identified if it contains all the design objects required by the user.

At step 604, various basenames of the design objects are identified. In various embodiments of the invention, the basenames are identified by traversing through the identified design library on the basis of the configured rules. In an embodiment of the invention, the directory names of the files, which form a part of the design objects, are identified as basenames. In another embodiment of the invention, the file names of the files, which form a part of the design objects, are identified as the basenames of the design objects. These basenames are used to determine the names for the one or more composite objects.

Thereafter, at step 508, the names for the composite objects are determined on the basis of the configured rules. These names need to be assigned to the composite objects that are formed at step 510.

At step 606, the files to be included in the one or more composite objects are identified on the basis of the rules configured for the EDA tool. In various embodiments of the invention, all the files that form a part of a particular design object are identified and thereby considered to be included in the corresponding composite object. It needs to be understood that these files are generally found in a distributed manner in the design library or in different directories.

At step 608, various files to be excluded from the composite objects are identified on the basis of the rules configured for the EDA tool. In an embodiment of the invention, the files that are not to be included in any composite object are identified on the basis of the configured inclusion rules. These files are temporary and execution files, and are therefore not included in any composite object. In another embodiment of the invention, the various files to be excluded from any composite object may be identified on the basis of the configured exclusion rules. These files may form a subset of the files that were identified as the files to be included at step 606.

At step 510, one or more files from the various files generated by the EDA tool are packaged into the one or more composite objects. These files are identified by the execution of steps 606 and 608. Further, these composite objects are formed in the design library identified at step 602.

At step 610, one or more attributes are assigned to the composite objects that are packaged at step 510. In various embodiments of the invention, these attributes may act as descriptors for the composite objects. In an embodiment of the invention, the attribute may be a tag assigned to a composite object. In another embodiment of the invention, the attribute may be an icon assigned to a composite object. In yet another embodiment of the invention, the attribute may be an action attached to a composite object, for example, a trigger assigned to a composite object.

At step 512, version control operations are performed on the composite objects. A new version of at least one of the one or more composite objects is created by re-applying the configured rules when any modification is made to the one or more composite objects.

The method and system described above has several advantages. Various embodiments of the invention provide an adaptor that is capable of organizing files, which are generated by various EDA tools, into composite objects. These files can thereby be accessed together in the form of composite objects, and version control operations may be performed on these composite objects. This reduces the complexity of accessing and maintaining individual files. Further, the memory size required to maintain the composite objects is less than that of maintaining individual files.

The system for organizing a plurality of files generated by an EDA tool, as described in the present invention or any of its components, may be embodied in the form of a computer system. Typical examples of a computer system include a general-purpose computer, a programmed microprocessor, a micro-controller, a peripheral integrated circuit element, and other devices or arrangements of devices that are capable of implementing the steps that constitute the method of the present invention.

The computer system may comprise a computer, an input device, and a display unit. The computer further comprises a microprocessor. The microprocessor is connected to a communication bus. The computer also includes a memory. The memory may be Random Access Memory (RAM) or Read Only Memory (ROM). The computer system further comprises a storage device, which may be a hard-disk drive or a removable storage drive, such as a floppy-disk drive, optical-disk drive, etc. The storage device may also be other similar means for loading computer programs or other instructions into the computer system. The computer system also includes a communication unit. The communication unit allows the computer to connect to other databases and the Internet through an Input/Output (I/O) interface, allowing the transfer as well as reception of data from other databases. The communication unit may include a modem, an Ethernet card, or any other similar device, which enables the computer system to connect to databases and networks, such as LAN, MAN, WAN and the Internet. The computer system facilitates inputs from a user through an input device, accessible to the system through an I/O interface.

The computer system executes a set of instructions that are stored in one or more storage elements in order to process input data. The storage elements may also hold data or other information as desired. The storage element may be in the form of an information source or a physical memory element present in the processing machine.

The programmable instructions may include various commands that instruct the processing machine to perform specific tasks such as the steps that constitute the method of the present invention. The method and systems described can also be implemented using only software programming or using only hardware or by a varying combination of the two techniques. The present invention is independent of the programming language used and the operating system in the computers. The instructions for the invention can be written in all programming languages including, but not limited to 'C', 'C++', 'Visual C++' and 'Visual Basic'. Further, the software may be in the form of a collection of separate programs, a program module with a larger program or a portion of a program module. The software may also include modular programming in the form of object-oriented programming. The processing of input data by the processing machine may be in response to user commands, results of previous processing or a request made by another processing machine. The invention can also be implemented in all operating systems and platforms including, but not limited to, 'Unix', 'Windows', 'DOS', and 'Linux'.

The programmable instructions can be stored and transmitted on computer readable medium. The programmable instructions can also be transmitted by data signals across a carrier wave. The present invention can also be embodied in a computer program product comprising a computer readable medium, the product capable of implementing the above methods and systems, or the numerous possible variations thereof.

While various embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A version control adaptor for organizing a plurality of files generated by a plurality of Electronic Design Automation (EDA) tools, wherein the plurality of files is organized into one or more composite objects, the version control adaptor being suitable for use with the plurality of EDA tools, the version control adaptor comprising:
   a. a configuring module, the configuring module providing a plurality of rules to a user using a computer, wherein the user configures the plurality of rules for any of the plurality of EDA tools by specifying a plurality of parameters including at least one of filename patterns, file formats, and directory name patterns;
   b. an identifying module, the identifying module identifying at least one design object amongst the plurality of files generated by any of the plurality of EDA tools based on the plurality of configured rules, wherein the at least one design object is identified by matching at least one of: filename patterns, file formats, and directory name patterns for the plurality of files with the at least one of filename patterns, file formats, and directory name patterns specified in the plurality of configured rules;
   c. a basename module, the basename module identifying basenames of the at least one identified design object based on the plurality of configured rules;
   d. a naming module, the naming module determining names for the one or more composite objects to be formed for the at least one identified design object using the basenames identified by the basename module based on the plurality of configured rules;
   e. a packaging module, the packaging module packaging one or more files of the plurality of files into the one or more composite objects, the one or more files to be included in the one or more composite objects being determined based on the plurality of configured rules; and
   f. a version control module, the version control module creating a new version of at least one of the one or more composite objects when at least one file of the one or more composite objects is modified, one or more files are added to the one or more composite objects, or one or more files are deleted from the one or more composite objects.

2. The version control adaptor according to claim 1, wherein the plurality of rules are configured for executing one or more software modules.

3. The version control adaptor according to claim 1 further comprising an attribute module, the attribute module associating attributes with the one or more composite objects.

4. The version control adaptor according to claim 1, wherein the identifying module comprises a library module, the library module identifying a design library generated by any of the plurality of EDA tools before identifying the at least one design object, wherein the design library comprises the at least one design object, the one or more composite objects being formed in the design library.

5. The version control adaptor according to claim 1, wherein the identifying module comprises the basename module.

6. The version control adaptor according to claim 1, wherein the packaging module comprises an inclusion module, the inclusion module identifying the one or more files to be included in the one or more composite objects based on the plurality of configured rules.

7. The version control adaptor according to claim 1, wherein the packaging module comprises an exclusion module, the exclusion module identifying one or more files of the plurality of files to be excluded from the one or more composite objects based on the plurality of configured rules.

8. A method for organizing a plurality of files generated by a plurality of Electronic Design Automation (EDA) tools, wherein the plurality of files are organized into one or more composite objects, the method comprising:
   a. providing a plurality of rules configurable for the plurality of EDA tools, the plurality of rules being provided to a user using a computer;
   b. configuring the plurality of rules by the user for any of the plurality of EDA tools by specifying a plurality of parameters including at least one of: filename patterns, file formats, and directory name patterns;
   c. identifying at least one design object amongst the plurality of files generated by any of the plurality of EDA tools based on the plurality of configured rules, wherein the at least one design object is identified by matching at least one of filename patterns, file formats, and directory name patterns for the plurality of files with the at least one of filename patterns, file formats, and directory name patterns specified in the plurality of configured rules;
   d. identifying basenames of the at least one identified design object based on the plurality of configured rules;
   e. determining names for the one or more composite objects to be formed for the at least one identified design object using the identified basenames, based on the plurality of configured rules;
   f. packaging one or more files of the plurality of files into the one or more composite objects, the one or more files forming the at least one design object, the one or more files to be included in the one or more composite objects being determined based on the plurality of configured rules; and g. performing version control operations on the one or more composite objects, wherein a new version of at least one of the one or more composite objects is created when at least one file of the one or more composite objects is modified, one or more files are added to the one or more composite objects, or one or more files are deleted from the one or more composite objects.

9. The method according to claim 8, wherein the plurality of rules are configured for executing one or more software modules.

10. The method according to claim 8 further comprising identifying a design library generated by any of the plurality of EDA tools before identifying the at least one design object, wherein the design library comprises the at least one design object, the one or more composite objects being formed in the design library.

11. The method according to claim 10, wherein at least one directory in any of the plurality of EDA tools is identified as the design library.

12. The method according to claim 8 further comprising associating attributes with the one or more composite objects.

13. The method according to claim 8, wherein the packaging comprises identifying the one or more files to be included in the one or more composite objects based on the plurality of configured rules.

14. The method according to claim 8, wherein the packaging comprises identifying one or more files of the plurality of files to be excluded from the one or more composite objects based on the plurality of configured rules.

15. A computer program product for use with a computer, the computer program product comprising a non-transitory computer readable-medium having a computer readable program code embodied therein for organizing a plurality of files generated by a plurality of Electronic Design Automation (EDA) tools, wherein the plurality of files is organized into one or more composite objects, the computer readable program code performing:

a. providing a plurality of rules configurable for the plurality of EDA tools, the plurality of rules being provided to a user;

b. configuring the plurality of rules by the user for any of the plurality of EDA tools by specifying a plurality of parameters including at least one of filename patterns, file formats, and directory name patterns;

c. identifying at least one design object amongst the plurality of files generated by any of the plurality of EDA tools based on the plurality of configured rules, wherein the at least one design object is identified by matching at least one of filename patterns, file formats, and directory name patterns for the plurality of files with the at least one of filename patterns, file formats, and directory name patterns specified in the plurality of configured rules;

d. identifying basenames of the at least one identified design object based on the plurality of configured rules, e. determining names for the one or more composite objects to be formed for the at least one identified design object, using the identified basenames based on the plurality of configured rules;

f. packaging one or more files of the plurality of files into the one or more composite objects, the one or more files forming the at least one design object, the one or more files to be included in the one or more composite objects being determined based on the plurality of configured rules; and g. performing version control operations on the one or more composite objects, wherein a new version of at least one of the one or more composite objects is created when at least one file of the one or more composite objects is modified, one or more files are added to the one or more composite objects, or one or more files are deleted from the one or more composite objects.

16. The computer program product according to claim 15, wherein the plurality of rules are configured for executing one or more software modules.

17. The computer program product according to claim 15, wherein the computer readable program code further performs identifying a design library generated by any of the plurality of EDA tools before identifying the at least one design object, wherein the design library comprises the at least one design object, the one or more composite objects being formed in the design library.

18. The computer program product according to claim 17, wherein at least one directory in any of the plurality of EDA tools is identified as the design library.

19. The computer program product according to claim 15, wherein the computer readable program code further performs associating attributes with the one or more composite objects.

20. The computer program product according to claim 15, wherein the packaging comprises identifying the one or more files to be included in the one or more composite objects based on the plurality of configured rules.

21. The computer program product according to claim 15, wherein the computer readable program code further performs identifying one or more files of the plurality of files to be excluded from the one or more composite objects based on the plurality of configured rules.

* * * * *